(12) United States Patent
Briones

(10) Patent No.: US 7,433,442 B2
(45) Date of Patent: Oct. 7, 2008

(54) LINEAR HALF-RATE CLOCK AND DATA RECOVERY (CDR) CIRCUIT

(75) Inventor: Luis J. Briones, Chandler, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 757 days.

(21) Appl. No.: 10/947,891

(22) Filed: Sep. 23, 2004

(65) Prior Publication Data
US 2006/0062339 A1 Mar. 23, 2006

(51) Int. Cl.
H03D 3/24 (2006.01)
(52) U.S. Cl. .............. 375/375; 375/374; 375/373; 375/376; 714/12; 704/270.1
(58) Field of Classification Search ............ 375/376, 375/362, 354, 374, 375; 714/12; 704/270.1
See application file for complete search history.

(56) References Cited

U.S. PATENT DOCUMENTS

| | | | |
|---|---|---|---|
| 4,535,459 A | 8/1985 | Hogge, Jr. | |
| 5,027,085 A | 6/1991 | DeVito | |
| 5,036,298 A | 7/1991 | Bulzachelli | |
| 5,278,873 A * | 1/1994 | Lowrey et al. | 375/371 |
| 5,757,857 A | 5/1998 | Buchwald | |
| 6,034,554 A * | 3/2000 | Francis et al. | 327/7 |
| 6,075,416 A | 6/2000 | Dalmia | |
| 6,225,831 B1 | 5/2001 | Dalmia et al. | |
| 6,301,318 B1 * | 10/2001 | Wei et al. | 375/371 |
| 6,614,314 B2 | 9/2003 | d'Haene et al. | |
| 7,170,964 B2 * | 1/2007 | Kocaman et al. | 375/376 |
| 2003/0142774 A1 * | 7/2003 | Takasoh et al. | 375/376 |
| 2004/0146131 A1 * | 7/2004 | Wilson | 375/375 |
| 2004/0258187 A1 * | 12/2004 | Jeong et al. | 375/376 |
| 2005/0119025 A1 * | 6/2005 | Mohindra et al. | 455/552.1 |
| 2006/0050828 A1 * | 3/2006 | Otomo et al. | 375/375 |

OTHER PUBLICATIONS

Lee, T. H. and J. F. Bulzacchelli, "A 155-MHz Clock Recovery Delay- and Phase-Locked Loop," IEEE Journal of Solid-State Circuits, vol. SC-27, pp. 1736-1746, Dec. 1992, ten pages.

(Continued)

*Primary Examiner*—Shuwang Liu
*Assistant Examiner*—Michael R Neff
(74) *Attorney, Agent, or Firm*—Meyertons Hood Kivlin Kowert & Goetzel, P.C.; Jeffrey C. Hood (57) ABSTRACT

A linear, half-rate clock and data recovery (CDR) circuit for recovering clock information embedded in a received data signal. The half-rate CDR circuit comprises a phase detector that may receive the data signal and generate a phase error signal representative of the phase difference between the received data signal and a clock signal produced by a voltage-controlled oscillator (VCO) of the CDR circuit. The half-rate CDR typically changes the frequency of the clock signal and generates a clock signal that is aligned with the baud center of the received data signal. More specifically, when the half-rate CDR circuit is in a locked condition, both the rising and falling edges of the clock signal are aligned with the baud center of the received data signal. The half-rate CDR preferably generates a clock signal with an average frequency that is half the data rate of a received data signal.

32 Claims, 8 Drawing Sheets

OTHER PUBLICATIONS

Hogge, C., "A Self-correcting Clock Recovery Circuit," IEEE J. Lightwave Technology, vol. LT-3, No. 6, pp. 1312-1314, Dec. 1985, three pages.

DeVito, L., "A Versatile Clock Recovery Architecture and Monolithic Implementation," Monolithic Phase-Locked Loops and Clock Recovery Circuits: Theory and Design, Edited by B. Razavi, pp. 405-420, IEEE Press, New York, 1996.

* cited by examiner

LINEAR HALF-RATE CLOCK AND DATA RECOVERY (CDR) CIRCUIT

BACKGROUND OF THE INVENTION

1. Field of the Invention

This invention relates generally to the field of digital interface design and, more particularly, to linear half-rate clock and data recovery (CDR) circuits.

2. Description of the Related Art

Designers usually embed clock information in transmitted data signals to meet greater bandwidth requirements in a reduced area. Information signals including only binary data without separate clock signals (i.e., the clock information is embedded in the data) may require only half the bandwidth for transmission when compared to the bandwidth that may be required to transmit information signals including separate data and clock signals. Since the clock information in data signals is preferably embedded in the data, transceivers typically include clock and data recovery (CDR) circuits to recover the embedded clock information of a received data signal to decode the data. Thus, CDR circuits typically perform critical functions in high-speed transceivers.

CDR circuits may be implemented using phase-locked loops (PLLs). PLLs are usually used in devices to receive a reference clock signal having a constant frequency and derive a local clock that is a fraction of and synchronized with the reference clock. However, CDR circuits are typically designed to recover clock information embedded in a data signal having a variable frequency. In this case, due to the variable frequency of the data signal, CDR circuits that are implemented using PLLs (e.g., digital PLLs) preferably include phase detectors having additional circuitry to continuously determine the phase difference between the received data signal and a local clock signal. The phase difference determined by the phase detector may then be used to change the frequency of the local clock accordingly to align one or both edges of the clock signal with the baud center of the data. When one or both edges of the clock signal are aligned with the baud center of the data, it is typically referred to as a locked condition because the clock signal is locked to the baud center of the data.

Figure 1A:
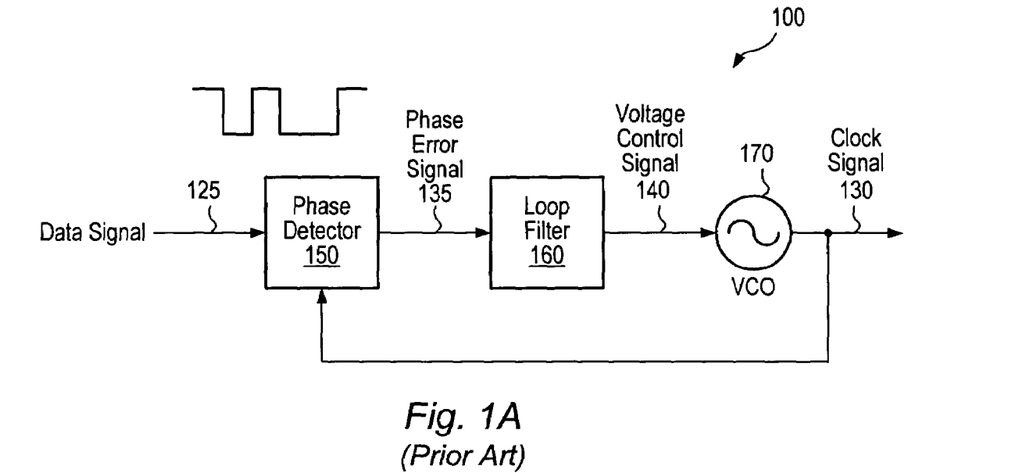
FIG. 1A illustrates a block diagram of a clock and data recovery (CDR) circuit implemented using a PLL design, according to prior art.

FIG. 1A is a block diagram of a CDR circuit 100 implemented using a PLL design. The CDR circuit 100 may include a phase detector 150, a loop filter 160, and a voltage-controlled oscillator (VCO) 170. The phase detector 150 typically receives two input signals: data signal 125 and clock signal 130. The phase detector 150 may determine the phase difference between the data signal 125 and the clock signal 130 to generate a phase error signal 135, which is generally a stream of positive and negative current pulses. The loop filter 160, which typically functions as an integrator, may receive the phase error signal 135 from the phase detector 150 and produce a voltage control signal 140 to drive the VCO 170. The VCO 170 outputs the clock signal 130 having a frequency that is dependent upon the voltage control signal 140.

The CDR circuit 100 may be a full-rate CDR circuit or a half-rate CDR circuit. Typically, the design of the phase detector 150 determines whether the CDR circuit 100 is a full-rate or a half-rate CDR circuit. A full-rate CDR preferably produces a clock signal with an average frequency that is the same as the data rate of the received data signal. A half-rate CDR preferably generates a clock signal with an average frequency that is half the data rate of the received data signal. For example, if the data rate is 2.5 Gbits/sec, then a full-rate CDR may generate a clock signal with an average frequency of 2.5 GHz, and a half-rate CDR may generate a clock signal with an average frequency of 1.25 GHz. Since power consumption is proportional to the square of oscillating frequency of the VCO, a half-rate CDR consumes less power than a full-rate CDR.

Figure 1B:
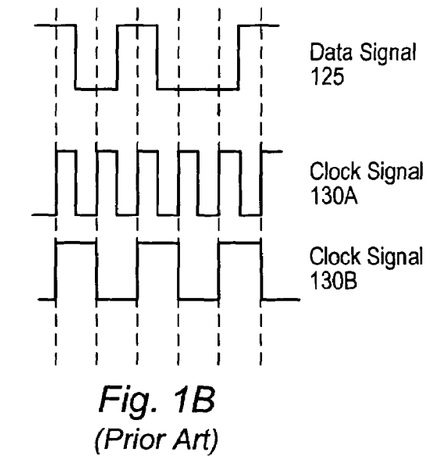
FIG. 1B illustrates a timing diagram showing the difference between a locked condition in a full-rate CDR circuit and a locked condition in a half-rate CDR circuit, according to prior art.

FIG. 1B is a timing diagram showing the difference between a locked condition in a full-rate CDR circuit and a locked condition in a half-rate CDR circuit. In a full-rate CDR circuit, a locked condition may be achieved when the rising edge of the full-rate clock signal 130A is aligned with the baud center of the data signal 125. In a half-rate CDR circuit, a locked condition may be achieved when both the rising and falling edges of the half-rate clock signal 130B are aligned with the baud center of data signal 125.

One common design of a full-rate CDR circuit for producing a clock signal that is aligned with the baud center of a data signal is the Hogge CDR circuit. A detailed description of the Hogge CDR is found in an article entitled "A Self-Correcting Clock Recovery Circuit", *IEEE Journal of Lightwave Technology*, Vol. LT-3, No. 6, pp. 1312-1314, December 1985, and in U.S. Pat. No. 4,535,459, August 1985, both by Charles R. Hogge, Jr. The Hogge CDR is a linear, compact, and efficient CDR design. However, the major drawbacks to this architecture are that the Hogge CDR is a full-rate CDR and it generates data dependent jitter or noise. Data dependent jitter typically refers to jitter in the phase of the clock signal generated by the VCO due to variations in data density of the receive data signal. More specifically, variations in data density result in inaccurate voltage control signals being sent to the VCO, which may result in variations in the phase of successive pulses of the clock signal generated by the VCO.

The CDR designed by DeVito greatly reduces some of the jitter problems of the Hogge CDR by including a triwave phase detector. A detailed description of this CDR design is found in an article entitled "A Versatile Clock Recovery Architecture and Monolithic Implementation", in *Monolithic Phase-Locked Loops and Clock Recovery Circuits, Theory and Design*, B. Razavi, Ed. New York: IEEE Press, 1996, and in U.S. Pat. No. 5,027,085, June 1991, both by Lawrence M. DeVito. A triwave phase detector may yield a CDR design with greatly diminished data dependent jitter. However, the drawbacks to this implementation are that the CDR is a full-rate CDR and it has a greater sensitivity to duty cycle distortion in the clock signal than the Hogge CDR. The greater duty cycle sensitivity is due to the uneven weighting used in the architecture with respect to the exclusive-OR gate outputs.

A solution that improves on the DeVito CDR design is the CDR circuit designed by Lee. A detailed description of this CDR design is found in an article entitled "A 155-MHz Clock Recovery Delay- and Phase-Locked Loop", *IEEE Journal of Solid-State Circuits*, Vol. 27, No. 12, pp. 1736-1745, December 1992, by Thomas H. Lee and John F. Bulzacchelli. This CDR circuit preserves the benefits of triwave implementation and reduces the duty cycle sensitivity by providing equal weighting to the different branches at the output of the exclusive-OR gates of the phase detector. The modified triwave phase detector has two distinct down-integration intervals clocked on opposite edges of the clock, rather than a single clock edge multiplied by two. As a consequence, duty cycle effects are attenuated. However, one of the drawbacks of this CDR design is that it is a full-rate CDR.

One common drawback of the linear CDR designs described above is that these CDR circuits are full-rate CDRs; therefore, as describe above, these linear full-rate CDRs consume more power than linear half-rate CDRs.

SUMMARY OF THE INVENTION

Various embodiments of a linear, half-rate clock and data recovery (CDR) circuit are disclosed for recovering clock information embedded in a received data signal. In one embodiment, the half-rate CDR circuit comprises a phase detector. The phase detector may receive the data signal and generate a phase error signal representative of the phase difference between the received data signal and a clock signal generated by a voltage-controlled oscillator (VCO) of the CDR circuit. The half-rate CDR typically changes the frequency of the clock signal and generates a clock signal that is aligned with the baud center of the received data signal. More specifically, when the CDR circuit is in a locked condition, both the rising and falling edges of the clock signal are aligned with the baud center of the received data signal. The half-rate CDR preferably generates a clock signal with an average frequency that is half the data rate of a received data signal. For example, if the data rate of the data signal is 2.5 Gbits/sec, then the half-rate CDR may generate a clock signal with an average frequency of 1.25 GHz. Since power consumption is proportional to the square of the frequency, the half-rate CDR circuit consumes less power than full-rate CDR designs.

The phase detector of the half-rate CDR circuit comprises a plurality of latches that may receive the clock signal. In one embodiment, a portion of the plurality of latches may be clocked by one edge of the clock signal and a remaining portion of the plurality of latches may be clocked by an opposite edge of the clock signal. The phase detector also comprises a plurality of logic gates that may receive output signals from the plurality of latches. The phase detector further comprises a summing circuit that may receive an output signal from each of the plurality of logic gates and generate the phase error signal in response to the received output signals from the logic gates.

The half-rate CDR also comprises a loop filter (e.g., an integrating loop filter) that may receive the phase error signal (e.g., positive and negative current pulses) and generate a voltage control signal in response to the received phase error signal. The half-rate CDR further comprises the voltage-controlled oscillator (VCO) that may receive the voltage control signal and generate the clock signal based on the received voltage control signal. In one embodiment, the VCO may be driven by the voltage control signal to align both the first and second edges of the clock signal with the baud center of the data signal.

In one embodiment, a system comprises a first device including a first transceiver for transmitting and receiving information and a second device including a second transceiver for transmitting and receiving information. The first transceiver comprises a first linear, half-rate clock and data recovery (CDR) circuit and the second transceiver comprises a second linear, half-rate CDR circuit. In one embodiment, the first and second transceivers may be configured to transmit and receive information via a communication medium, such as a PCI Express bus.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

Figure 2:
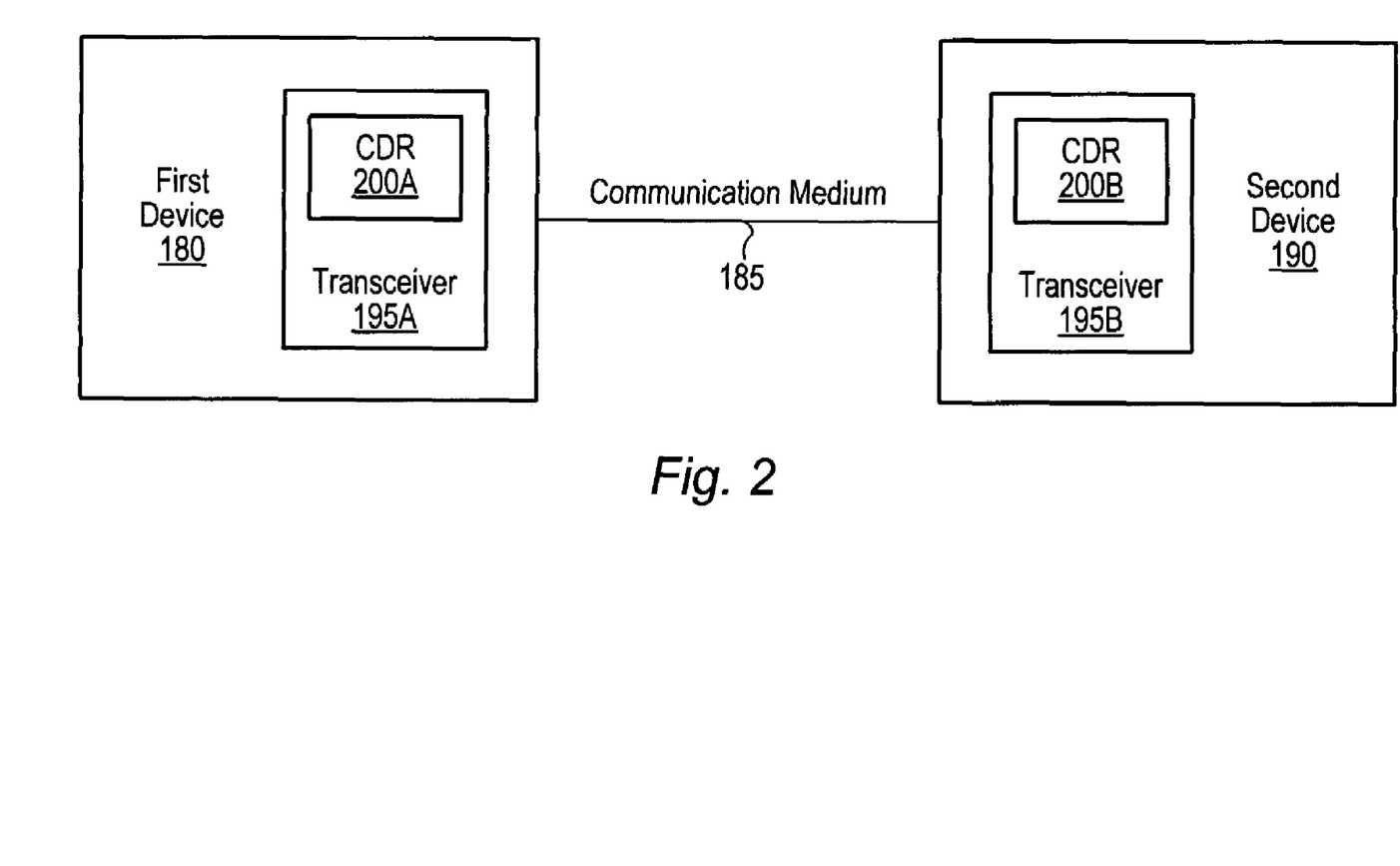
FIG. 2 is a block diagram of one embodiment of a communication system comprising a first device and a second device, each including a linear, half-rate CDR circuit.

FIG. 2 is a block diagram of one embodiment of a communication system comprising a first device 180 and a second device 190, each including a linear, half-rate clock and data recovery (CDR) circuit 200. Each of the half-rate CDR circuits 200A and 200B may be included in an integrated circuit (IC), for example, a digital IC. In one embodiment, the half-rate CDR 200A may be comprised in a transceiver 195A of the first device 180, and the half-rate CDR 200B may be comprised in a transceiver 195B of the second device 190. The transceivers 195A and 195B may be configured to transmit and receives information (e.g., digital signals) via communication medium 185, such as a PCI Express bus. It is noted however that in other embodiments the half-rate CDRs may be used in transceivers to communicate via other types of communication standards, such as Serial ATA, USB, IEEE 1394, or Ethernet, among others.

The first and second devices 180 and 190 may be any of numerous types of devices, as desired, such as computer systems, Ethernet devices, Internet appliances, and disk drives, and may be used in several applications, such as wired (e.g., PCI Express) or wireless (e.g., 802.11g) communications. In one embodiment, the first device 180 (e.g., a first computer system) may communicate with the second device (e.g., a second computer system) via a network (e.g., LAN). It is noted however that the examples described above are exemplary only; in other embodiments the half-rate CDR 200 may be comprised in any type of communication device and may be used in any application domain. For example, the half-rate CDR circuit 200 may be included in any system that recovers clock information from a received random data stream.

It should be noted that the components described with reference to FIG. 2 are meant to be exemplary only, and are not intended to limit the invention to any specific set of components or configurations. For example, in various embodiments, one or more of the components described may be omitted, combined, modified, or additional components included, as desired.

Figure 3:
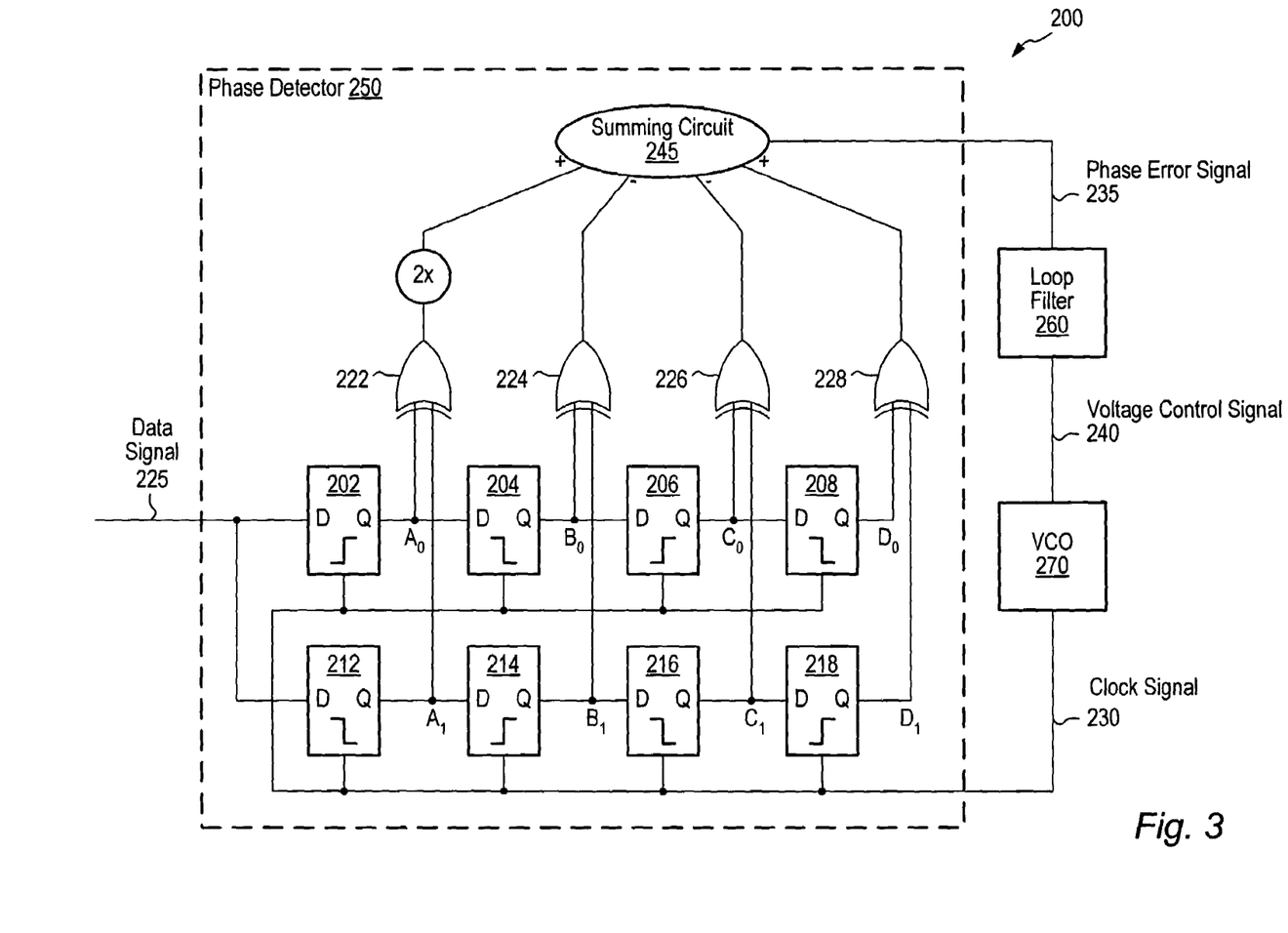
FIG. 3 is a block diagram of one embodiment of a linear, half-rate CDR circuit.

FIG. 3 is a block diagram of one embodiment of a linear, half-rate CDR circuit 200. Components that correspond to those shown in FIG. 2 are numbered identically for simplicity and clarity. The half-rate CDR 200 may recover clock information embedded in a received data signal 225 (e.g., a random data stream) to generate a clock signal 230 that is aligned with the baud center of the data signal 225 when the CDR 200 is in a locked condition. More specifically, when the CDR circuit 200 is in a locked condition, both the rising and falling edges of a half-rate clock signal 230 are preferably locked to the baud center of the received data signal 225. The half-rate CDR 200 may generate a clock signal (e.g., clock signal 230) with an average frequency that is half the data rate of a received data signal (e.g., data signal 225). For example, if the data rate of the data signal 225 is 2.5 Gbits/sec, then the half-rate CDR 200 may generate a clock signal with an average frequency of 1.25 GHz.

It is noted that when the CDR circuit 200 is in a locked condition, in some instances, both the rising and falling edges of the half-rate clock signal 230 may be substantially aligned with the baud center of the received data signal 225. In one example, to be substantially aligned with the baud center may be defined to mean aligned within ±5% of the baud center, depending on noise and process variations, among other factors.

The half-rate CDR 200 may be implemented using a PLL design (e.g., a Digital PLL design) and may comprise a phase detector 250, a loop filter 260, and a voltage-controlled oscillator (VCO) 270. In one embodiment, the phase detector 250 may be a triwave phase detector and may comprise D latches 202, 204, 206, 208, 212, 214, 216, and 218. The phase detector 250 may further comprise exclusive-OR gates 222, 224, 226, and 228, and a summing circuit 245.

The phase detector 250 may comprise four input stages; each input stage may comprise a pair of the latches. In one embodiment, a first input stage of the phase detector 250 may comprise the latch 202 and the latch 212, a second input stage of the phase detector 250 may comprise the latch 204 and the latch 214, a third input stage of the phase detector 250 may comprise the latch 206 and the latch 216, and a fourth input stage of the phase detector 250 may comprise the latch 208 and the latch 218. The latches 202 and 212 from the first input stage of the phase detector 250 may each receive the data signal 225. Also, each of the latches of the phase detector 250 may receive the half-rate clock signal 230. In one embodiment, a latch of each of the pairs of latches may be clocked by one edge of the clock signal 230 and the other latch of each of the pairs of latches may be clocked by the other edge of the clock signal 230. For example, as indicated in FIG. 3, latch 202 from the first input stage of the phase detector 250 may be clocked by the rising edge of the clock signal 230 and latch 212 may be clocked by the falling edge of the clock signal 230. In another example, latch 208 from the fourth input stage of the phase detector 250 may be clocked by the falling edge of the clock signal 230 and latch 218 may be clocked by the rising edge of the clock signal 230. Therefore, at each stage, the phase detector 250 may use both the rising and the falling edges of the clock signal 230 to determine whether the clock signal 230 is leading or lagging the baud center of the data signal 225 and to ultimately lock to the baud center.

The phase detector 250 may include one exclusive-OR gate for each of the input stages. The exclusive-OR gate 222 may receive the output of the latch 202 at a first input and the output of the latch 212 at a second input. Also, the exclusive-OR gate 224 may receive the output of the latch 204 at a first input and the output of the latch 214 at a second input. In addition, the exclusive-OR gate 226 may receive the output of the latch 206 at a first input and the output of the latch 216 at a second input. Furthermore, the exclusive-OR gate 228 may receive the output of the latch 208 at a first input and the output of the latch 218 at a second input. The summing circuit 245 preferably adds the outputs of the exclusive-OR gates 222, 224, 226, and 228 over time to produce the phase error signal 235, as will be further described below with reference to FIG. 6. It is noted that the polarity associated with the summing circuit 245 may be dependent at least on the configuration of the VCO 270, e.g., in some embodiments, the polarity associated with the summing circuit 245 may be reversed accordingly. The phase error signal 235 is the output of the phase detector 250 and is typically a stream of positive and negative current pulses.

The loop filter 260, which typically functions as an integrator with a stability zero, may receive the phase error signal 235 from the phase detector 250 and produce a voltage control signal 240 to drive the VCO 270. A conventional VCO (e.g., a ring oscillator) is a device that produces a periodic oscillation, and the frequency of the oscillation (e.g., clock signal 230) may be controlled by a control voltage (e.g., voltage control signal 240). Therefore, the VCO 170 may output the clock signal 230 having a frequency that is dependent upon the voltage control signal 240. More specifically, the voltage control signal 240 preferably drives the VCO to produce a half-rate clock signal (e.g., clock signal 230) having edges that are locked to the baud center of the received data signal 225. As described above, the clock signal 230 generated by the VCO 170 is sent to the phase detector 250 to clock each of the plurality of latches.

It should be noted that the components described with reference to FIG. 3 are meant to be exemplary only, and are not intended to limit the invention to any specific set of components or configurations. For example, in various embodiments, one or more of the components described may be omitted, combined, modified, or additional components included, as desired. For instance, in one embodiment, a current-controlled oscillator may be used rather than a VCO.

Figure 4:
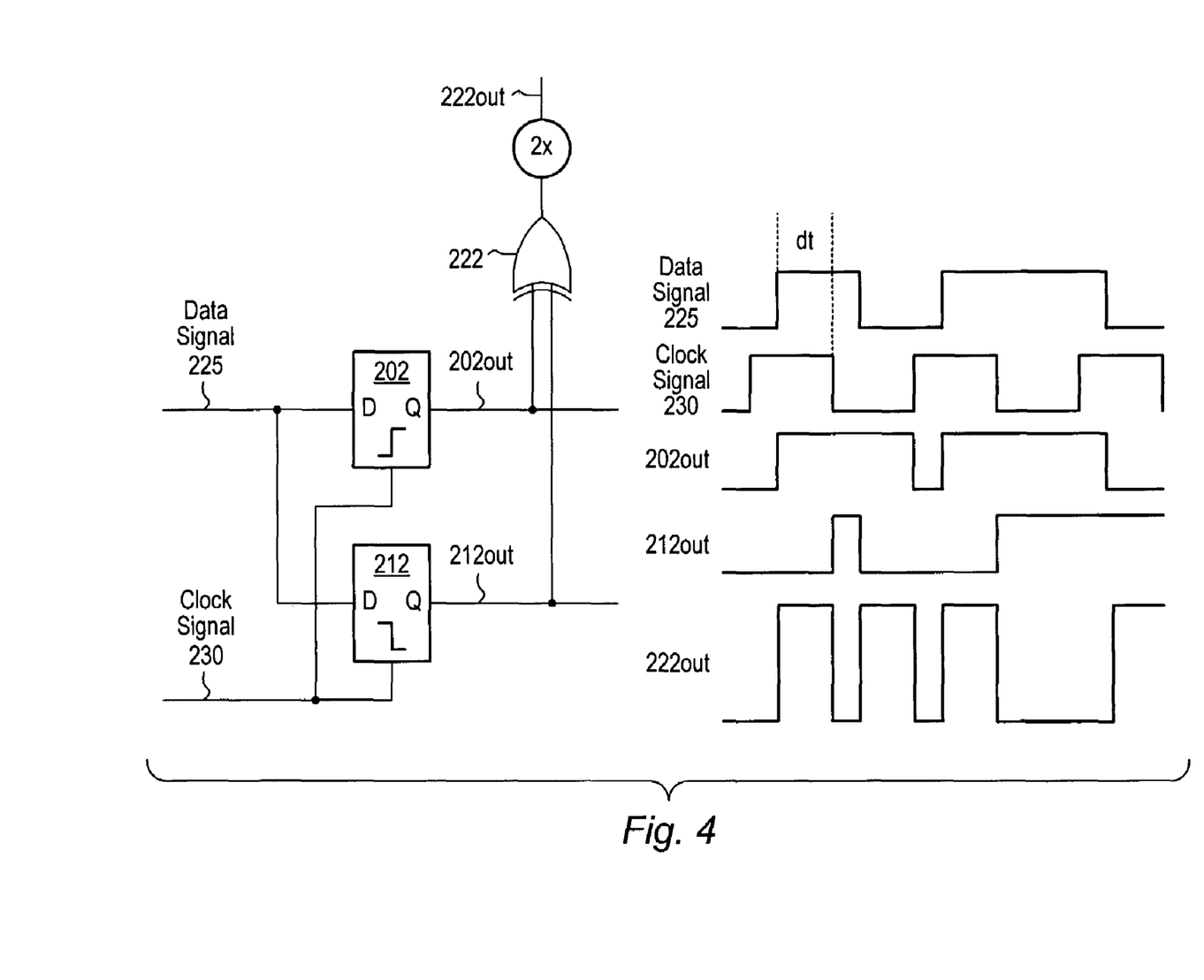
FIG. 4 is a block diagram illustrating a first section of the CDR circuit of FIG. 3, according to one embodiment of the invention.

FIG. 4 is a block diagram illustrating a first section of the CDR circuit 200 of FIG. 3, according to one embodiment of the invention. More specifically, FIG. 4 shows the latches 202 and 212 of the first input stage of the phase detector 250 coupled to the exclusive-OR gate 222. Components that correspond to those shown in FIG. 3 are numbered identically for simplicity and clarity. Referring collectively to FIG. 3 and FIG. 4, as described above, latches 202 and 212 may receive the data signal 225. The latches 202 and 212 may be transparent when the clock signal 230 is high and low, respectably. Therefore, the latches 202 and 212 may allow the data to pass or may inhibit the data from passing at opposite edges of the clock signal 230.

In one instance, as shown in the timing diagram of FIG. 4, the baud center of the data signal 225 may be leading the clock signal 230, and the rising edge of the data signal 225 may be leading the falling edge of the clock signal 230 by dt. To detect the rising and falling edges of the data signal 225, which may be necessary to generate the phase error signal 235 shown in FIG. 3, the first section of the phase detector 250 may produce an edge detection signal (i.e., 222out). First, since the latch 202 may be clocked by the rising edge of the clock signal 230, the output of latch 202 (i.e., 202out) may produce a pulse of width dt+tclk/2 or dt+½*(period of clock signal 230), as shown in the timing diagram of FIG. 4. Second, since the latch 212 may be clocked by the falling edge of the clock signal 230, the output of latch 212 (i.e., 212out) may produce a pulse of width tclk/2 XOR dt, as shown in FIG. 4 by the first bit that is output from latch 212. Lastly, 202out and 212out may be XORed together by exclusive-OR gate 222 to generate an output pulse of width dt (i.e., 222out). Note that the rising edge of each of the output pulses of signal 222out is typically aligned with either the rising or falling edge of the data signal 230. Therefore, the string of output pulses (each pulse of width dt) that are output from exclusive-OR gate 222 may serve as an edge detection signal to allow the phase detector 250 to determine the phase error signal 235. It is also noted that the amplitude of the string of pulses output from exclusive-OR gate 222 may be multiplied by two to produce the signal 222out, as will be describe below with reference to FIG. 6.

In the timing diagram of FIG. 4, the baud center of the data signal 225 is leading the falling edge of the clock signal 230. It is noted that the width of dt may depend upon how much the data signal 230 is leading or lagging the clock signal 230. For example, when the half-rate CDR 200 is locked, i.e., the rising and falling edges of the clock signal 230 may be aligned with the baud center of the data signal 225, the exclusive-OR gate 222 may produce pulses that are approximately tclk/4 in width, as shown below in FIG. 5A.

Figure 5A:
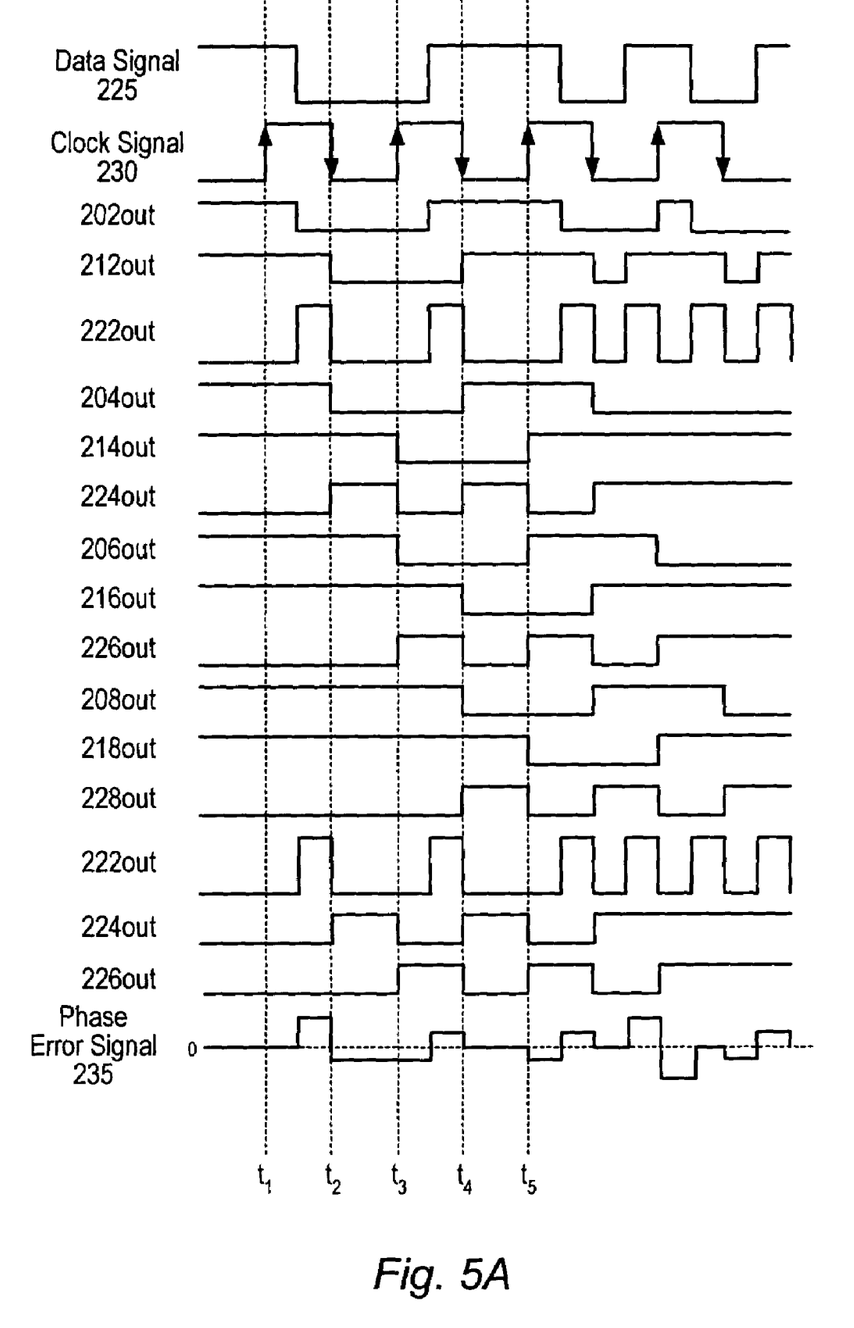
FIG. 5A illustrates a timing diagram showing output signals at various stages of the half-rate CDR circuit, according to one embodiment of the invention.

FIG. 5A illustrates a timing diagram showing output signals at various stages of the half-rate CDR 200, according to one embodiment of the invention. More specifically, the timing diagram shows output signals when the half-rate CDR 200 is in a locked condition, i.e., the rising and falling edges of the half-rate clock signal 230 are aligned with the baud center of the data signal 225.

Referring collectively to FIG. 3 and FIG. 5A, the data signal 225 may be received at one of the inputs of both the latches 202 and 212. Between times $t_1$ and $t_2$, the signal 202out and the signal 212out may be XORed and the amplitude of the resulting signal may be multiplied by two to produce the signal 222out. Note that the output of latch 212 may remain a logic high value between times $t_1$ and $t_2$, since the latch 212 is not clocked until time $t_2$, i.e., the falling edge of the clock signal 230. As shown in FIG. 5A, when the logic values of signal 202out and 212out are the same (i.e., at time $t_1$) the exclusive-OR gate 222 may produce a logic low value. However, when the logic values of signal 202out and 212out are different (i.e., the latter part of the time period between times $t_1$ and $t_2$) the exclusive-OR gate 222 may produce a logic high value. In this instance, since the half-rate CDR 200 is locked, a pulse of width tclk/4 may be produced between times $t_1$ and $t_2$. During this time period, the outputs of exclusive-OR gates 224, 226, and 228 (i.e., 224out, 226out, and 228out) may be logic low. Therefore, the summing circuit 245 may produce a phase error signal 235 that corresponds to the signal 222out. More specifically, the summing circuit 245 may produce a current pulse (i.e., phase error signal 235) of width tclk/4 and double (2×) the reference amplitude. In one embodiment, as will be further described in FIG. 6, the reference amplitude may be dependent upon the current sources that may be used in the summing circuit 245.

Between times $t_2$ and $t_3$, the signal 204out and the signal 214out may be XORed to produce the signal 224out. Note that the output of latch 214 may remain a logic high value between times $t_2$ and $t_3$, since the latch 214 is not clocked until time $t_3$, i.e., the rising edge of the clock signal 230. As shown in FIG. 5A, since the logic values of signal 204out and 214out are different between times $t_2$ and $t_3$, the exclusive-OR gate 224 may produce a logic high value during this time period. In this instance, since the half-rate CDR 200 is locked, a pulse of width tclk/2 may be produced between times $t_2$ and $t_3$. During this time period, the outputs of exclusive-OR gates 222, 226, and 228 (i.e., 222out, 226out, and 228out) may be logic low. Therefore, the summing circuit 245 may produce a phase error signal 235 that corresponds to the signal 224out. More specifically, the summing circuit 245 may produce a negative current pulse (i.e., phase error signal 235), which in this case may extend to the time period between times $t_3$ and $t_4$, having an amplitude approximately equal to −1 times (−1×) the reference amplitude. In one embodiment, as will be further described in FIG. 6, depending on the current sources that may be used in the summing circuit 245, the phase error signal 235 may be positive or negative.

Between times $t_3$ and $t_4$, the signal 202out and the signal 212out may be XORed and the amplitude of the resulting signal is multiplied by two to produce the signal 222out, and the signal 206out and the signal 216out may be XORed to produce the signal 226out. During this time period, the outputs of exclusive-OR gates 224 and 228 (i.e., 224out and 228out) may be logic low. For example, signals 208out and 218out are both logic high; therefore, the output of exclusive-OR gate 228 may be logic low. Therefore, the summing circuit 245 may produce a phase error signal 235 that corresponds to the sum of 222out and 226out. In this example, the summing circuit may produce a negative current pulse (i.e., phase error signal 235) having an amplitude approximately equal to −1 times (−1×) the reference amplitude, in the first part of the time period between times $t_3$ and $t_4$. Then, the summing circuit may produce a positive current pulse having an amplitude approximately equal to 1 times (1×) the reference amplitude, in the latter part of the time period between times $t_3$ and $t_4$. It is noted that in other time periods (e.g., between times $t_4$ and $t_5$) the same procedure may be followed to derive the corresponding signals.

As shown in FIG. 5A, when the half-rate CDR 200 is locked, each of the output pulses of signal 222out may be of width tclk/4. Also, the rising edge of each of the output pulses of signal 222out may be aligned with either the rising or falling edge of the data signal 230. Therefore, the string of output pulses that are output from exclusive-OR gate 222 may serve as an edge detection signal to allow the phase detector 250 to determine the phase error signal 235. It is noted that the amplitude of the string of pulses output from exclusive-OR gate 222 may be multiplied by two to produce the signal 222out, as will be describe below with reference to FIG. 6. Furthermore, as shown in FIG. 5A, each of the output pulses of signals 224out, 226out, and 228out may be of width tclk/2 and may be aligned with the clock signal 230. Therefore, the strings of output pulses that are output from exclusive-OR gates 224, 226, and 228 may serve as reference signals to allow the phase detector 250 to determine the phase error signal 235. The phase detector 250 may use both the rising and the falling edges of the clock signal 230, the edge detection signal, and the reference pulses to determine whether the clock signal 230 is leading or lagging the baud center of the data signal 225 and to maintain or achieve the locked condition.

Additionally, as shown in the timing diagram of FIG. 5A, when the half-rate CDR 200 is locked, the phase error signal 235 may include both positive and negative current pulses. In FIG. 5A, the sum of the positive and negative values corresponding to the positive and negative current pulses is equal to zero, i.e., the average area of the pulses is equal to zero. Therefore, when the VCO 270 receives the voltage control signal 240, which is derived from the phase error signal 235, the VCO 270 may maintain the locked condition of the CDR 200. More specifically, since the average area of the pulses is equal to zero, the phase detector 250 may not introduce a significant amount of jitter, and therefore the rising and falling edges of the clock signal 230 may still be locked to the baud center of data signal 225.

Figure 5B:
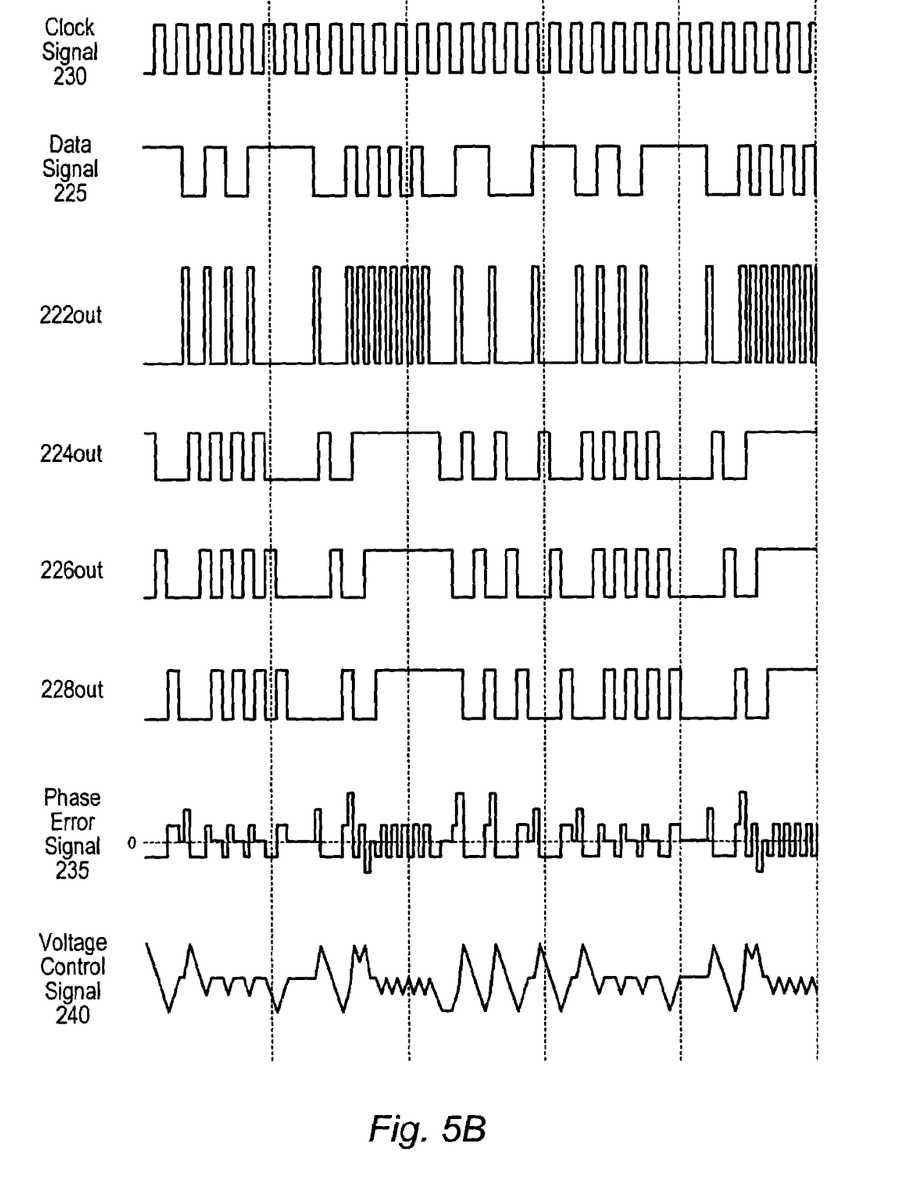
FIG. 5B illustrates a timing diagram showing output signals at various stages of the half-rate CDR circuit, according to one embodiment of the invention.

FIG. 5B illustrates another timing diagram showing output signals at various stages of the half-rate CDR 200, according to one embodiment of the invention. This timing diagram also shows output signals when the half-rate CDR 200 is in a locked condition, i.e., the rising and falling edges of a half-rate clock signal 230 are aligned with the baud center of a data signal 225. The timing diagram of FIG. 5B illustrates output signals 222out, 224out, 226out, 228out, phase error signal 235, and voltage control signal 240. The output signals of FIG. 5B may be derived similarly as described with reference to FIG. 5A.

As shown in FIG. 5B, when the half-rate CDR 200 is locked, the phase error signal 235 (e.g., the output of the phase detector 250 of FIG. 3) may include both positive and negative current pulses. Also, as described above, when the half-rate CDR 200 is locked, the average area associated with the current pulses is equal to zero. FIG. 5B further illustrates the voltage control signal 240. The voltage control signal 240 is a triwave output that may be derived by integrating the phase error signal 235, e.g., via the loop filter 260 of FIG. 3 (i.e., an integrating loop filter). The voltage control signal 240 may be used to drive the VCO 270, to output a half-rate clock signal 230 having a frequency that is dependent on the voltage control signal 240 and having edges that are locked to the baud center of the data signal 225. It is noted that each of the phase error signal 235 and the voltage control signal 240 shown in FIG. 5B is not drawn to scale compared to the rest of the signals.

Figure 6:
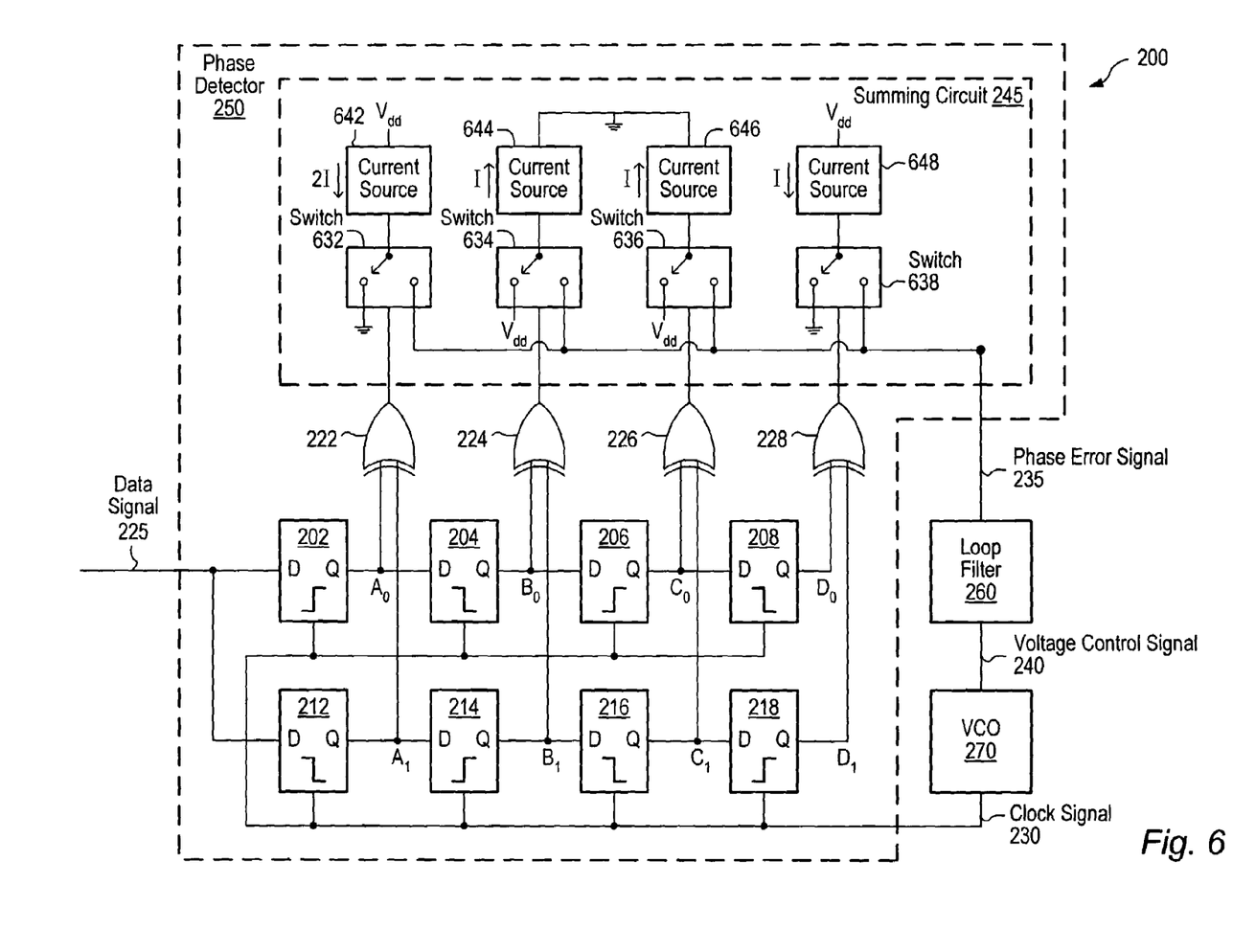
FIG. 6 is a block diagram of one embodiment of the linear, half-rate CDR circuit shown in FIG. 3.

FIG. 6 is a block diagram of one embodiment of the linear, half-rate CDR circuit 200 shown in FIG. 3. Components that correspond to those shown in FIG. 3 are numbered identically for simplicity and clarity. The CDR circuit 200 of FIG. 6 illustrates one embodiment of the summing circuit 245. In one embodiment, the summing circuit 245 may be included in a charge pump circuit. The summing circuit 245 may include switches 632, 634, 636, and 638, which may be coupled to current sources 642, 644, 646, and 648, respectively, and to the loop filter 260. In one embodiment, the current sources 642 and 648 may be sourcing sources and the current sources 644 and 646 may be sinking sources. Also, in one embodiment, the current source 642 may supply a current of twice the magnitude compared to the other current sources. It is noted however that in other embodiments the summing circuit 245 may be implemented by other techniques and designs.

In one embodiment, the exclusive-OR gates 222, 224, 226, and 228 may be coupled to the switches 632, 634, 636, and 638, respectively. The output signals from the exclusive-OR gates (i.e., 222out, 224out, 226out, and 228out) may serve as control signals to change the state of the switches. The switches may be in an OFF state when they are connected to ground or $V_{dd}$, and in an ON state when they are connected to the loop filter 260. When an output signal from a particular exclusive-OR gate is logic high, the corresponding switch is changed to the ON state, and when the output signal is logic low, the corresponding switch is changed to the OFF state.

Referring collectively to FIGS. 3, 5A, and 6, in one instance, when the logic values of 202out and 212out are different, the exclusive-OR gate 222 may produce a logic high value (i.e., 222out). In response to the logic high, the switch 632 may change to the ON state and the current source 642 may begin driving current (i.e., 2I). As described above, the other exclusive-OR gates may not produce logic high values; therefore, the phase error signal 235 during this particular time period (e.g., between times $t_1$ and $t_2$ of FIG. 5A) may correspond to the current from sourcing source 642. In other instances, the sum of the currents from sinking source 646 (i.e., a negative current I) and sourcing course 648 (i.e., a positive current I) may correspond to the phase error signal 235. It is noted that any combination of current sources may be driving the phase error signal 235 at any given time. The magnitude and the polarity of the phase error signal 235 may be dependent upon the magnitude and polarity of the current being driven by one or more of the current sources. As a result, the phase error signal 235 may be comprised of positive and negative current pulses.

Figure 7:
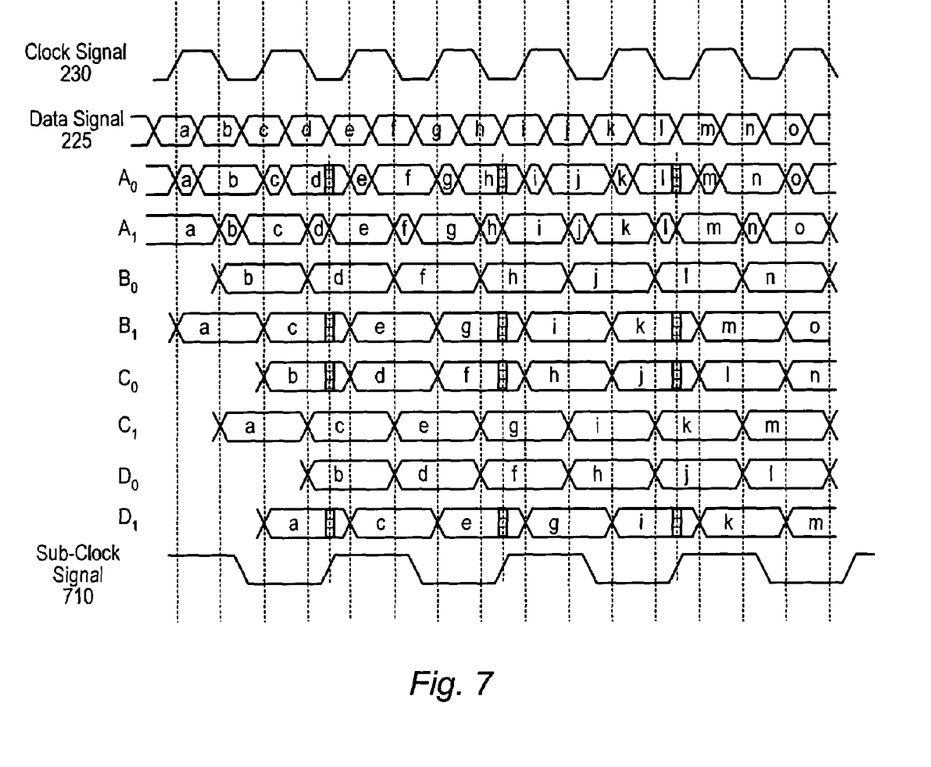
FIG. 7 illustrates a timing diagram showing bits of a data signal over time at various nodes of the half-rate CDR circuit of FIG. 3, according to one embodiment of the invention.

FIG. 7 illustrates a timing diagram showing the bits of data signal 225 over time at various nodes of the half-rate CDR circuit 200 of FIG. 3, according to one embodiment of the invention. In the example shown in FIG. 7, the CDR circuit 200 may be in a locked condition, since the rising and falling edges of the half-rate clock signal 230 are aligned with the baud center of the data signal 225. Referring collectively to FIG. 3 and FIG. 7, the bits of data signal 225 (i.e., bits a-o) are shown as they progress over time through the different stages of the CDR 200. More specifically, the bits of the data signal 225 are shown as they latched by the various latches and move through nodes $A_0$, $A_1$, $B_0$, $B_1$, $C_0$, $C_1$, $D_0$, and $D_1$ of the CDR 200 of FIG. 3. The sub-clock signal 710 shown in FIG. 7 may be a (Clk+90°)/2 clock signal derived from the VCO 270, which is equivalent to the clock signal 230 shifted in phase by 90° and divided by two. The sub-clock signal 710 may be used to sample one or more bits as they move over time through the different stages of the CDR 200.

In one embodiment, 4 bits (i.e., a nibble) may be sampled at the same time by sub-clock 710 (e.g., the rising edge). For example, bit a may be sampled at node $D_1$, bit b may be sampled at node $C_0$, bit c may be sampled at node $B_1$, and bit d may be sampled at node $A_0$ by the first rising edge of the sub-clock 710. Then, bits e, f, g, and h may be sampled at the same nodes by the second rising edge of the sub-clock 710, and bits i, j, k, and l may be sampled at the same nodes by the following rising edge of the sub-clock 710. In one embodiment, since bits d, h, l do not have the same setup and hold time as the other bits, a second schema may be implemented to clock 3 bits per sample. For example, in one embodiment, sample $D_1$ (a), $C_0$ (b), $B_1$ (c) in the first sample, $D_0$ (d), $C_1$ (e), $B_0$ (f) in the second sample, and $D_1$ (g), $C_0$ (h), $B_1$ (i) in the third sample, and so on. As described above, all three bits may be sampled at the same time. In the above implementations, since all the bits may be sampled at the same time, there may be no clock skew to account for in this application. It is noted that in other embodiments any number of bits may be sampled at the same time, for example, two bits or six bits may be sampled at the same time.

After the bits are sampled, the data may be stored in a first-in, first-out (FIFO) buffer. In one embodiment, it may be necessary to convert the serial data into parallel data. Therefore, after the data is stored in the FIFO, the serial data may be sent to a demultiplexer to be converted to parallel data. It is noted however that any serial to parallel mechanism may be used. It is also noted that the sampling scheme describe above may offer one method for sampling the data received at the CDR 200. However, in other embodiments, other sampling techniques may be implemented.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A linear, half-rate clock and data recovery (CDR) circuit comprising:
   a phase detector operable to receive a data signal and generate a phase error signal representative of the phase difference between the data signal and a clock signal, the phase detector comprising:
   a plurality of pairs of latches operable to receive the clock signal, wherein each pair of the plurality of pairs of latches comprises a first latch, and a second latch configured in parallel with the first latch, wherein the first latch is operable to be clocked by one edge of the clock signal and the second latch is operable to be clocked by an opposite edge of the clock signal,
   a plurality of logic gates, wherein each of the plurality of logic gates is configured to receive an output from the first latch of a respective pair of the plurality of pairs of latches, and an output from the second latch of the respective pair of the plurality of pairs of latches, and
   a summing circuit operable to receive an output signal from each of the plurality of logic gates and generate the phase error signal in response to the output signals from the logic gates;
   a loop filter operable to receive the phase error signal and generate a voltage control signal in response to the phase error signal; and
   a voltage-controlled oscillator (VCO) operable to receive the voltage control signal and generate the clock signal in response to the voltage control signal, wherein the VCO is driven by the voltage control signal to align both the first and second edges of the clock signal with a baud center of the data signal.

2. The half-rate CDR of claim 1, wherein the average frequency of the clock signal is half the frequency compared to the data rate of the data signal when the first and second edges of the clock signal are aligned with the baud center of the data signal.

3. The half-rate CDR of claim 1, wherein each of a plurality of input stages of the half-rate CDR is coupled to a respective pair of the plurality of pairs of latches.

4. The half-rate CDR of claim 1, wherein the phase detector is operable to use both the rising and falling edges of the clock signal to determine whether the clock signal is leading or lagging the baud center of the data signal and to generate the corresponding phase error signal to lock the rising and falling edges of the clock signal to the baud center of the data signal.

5. The half-rate CDR of claim 1, wherein the data signal is an information signal having embedded clock information.

6. The half-rate CDR of claim 1, wherein summing circuit is comprised in a charge pump circuit.

7. The half-rate CDR of claim 1, wherein the summing circuit comprises a plurality of switches coupled to a plurality of current sources, wherein the output signals produced by the logic gates are operable to change a state of the switches, and wherein the state of the switches is operable to determine whether one or more of the current sources drive current to the loop filter.

8. The half-rate CDR of claim 7, wherein a first one of the plurality of current sources, coupled to a first one of the logic gates via a first one of the switches, is operable to drive current of twice the magnitude compared to the remaining current sources.

9. The half-rate CDR of claim 1, wherein the phase detector is operable to produce a phase error signal comprising positive and negative current pulses.

10. The half-rate CDR of claim 9, wherein the sum of positive and negative values corresponding to the positive and negative current pulses equals to zero.

11. The half-rate CDR of claim 1, wherein one or more data bits of the data signal are sampled at the same time at different nodes of the phase detector.

12. The half-rate CDR of claim 1, where the plurality of logic gates are exclusive-OR gates.

13. A phase detector circuit for generating a phase error signal representative of the phase difference between a data signal and a clock signal, the phase detector circuit comprising:
   n latches operable to receive the clock signal, wherein each of n/2 input stages of the phase detector circuit comprises a respective pair of latches of the n latches, wherein a respective pair of latches comprised at a first input stage is operable to receive the data signal, wherein each respective pair of latches comprises a first latch, and a second latch configured in parallel with the first latch, wherein the first latch is operable to be clocked by one edge of the clock signal and the second latch is operable to be clocked by an opposite edge of the clock signal;
   n/2 logic gates, wherein the output signal of the first latch of each of the pairs of latches is received at a first input of the corresponding logic gate and the output signal of the second latch of each of the pairs of latches is received at a second input of the corresponding logic gate; and
   a summing circuit operable to receive an output signal from each of the n/2 logic gates and to generate the phase error signal in response to the output signals, wherein said phase error signal to be used to align both the first and second edges of the clock signal with a baud center of the data signal;
   wherein n is an even integer number greater than 3.

14. The phase detector circuit of claim 13, wherein the average frequency of the clock signal is half the frequency compared to the data rate of the data signal when the first and second edges of the clock signal are aligned with the baud center of the data signal.

15. The phase detector circuit of claim 13, wherein both the rising and falling edges of the clock signal are used to determine whether the clock signal is leading or lagging the baud center of the data signal and to generate the corresponding phase error signal to lock the rising and falling edges of the clock signal to the baud center of the data signal.

16. The phase detector circuit of claim 13, wherein the data signal is an information signal having embedded clock information.

17. The phase detector circuit of claim 13, wherein the summing circuit comprises n/2 switches and n/2 current sources, wherein the output signals produced by the logic gates are operable to change a state of the switches, and wherein the state of the switches is operable to determine whether one or more of the current sources drive current to an output of the phase detector circuit.

18. The phase detector circuit of claim 13, wherein a first one of the n/2 current sources, coupled to a first one of the n/2 logic gates via a first one of the n/2 switches, is operable to drive current of twice the magnitude compared to the remaining current sources.

19. The phase detector circuit of claim 13, comprised in a linear, half-rate clock and data recovery (CDR) circuit.

20. The phase detector circuit of claim 13, wherein the phase error signal comprises positive and negative current pulses.

21. The phase detector circuit of claim 20, wherein the sum of positive and negative values corresponding to the positive and negative current pulses equals to zero.

22. The phase detector circuit of claim 13, wherein one or more data bits of the data signal are sampled at the same time at different nodes of the phase detector circuit.

23. A phase detector circuit for generating a phase error signal representative of the phase difference between a data signal and a clock signal, the phase detector circuit comprising:
   a first latch operable to receive the data signal, wherein the first latch is to be clocked by the first edge of the clock signal;
   a second latch operable to receive the data signal, wherein the second latch is to be clocked by the second edge of the clock signal;
   a first logic gate operable to receive an output signal of the first latch at a first input and an output signal of the second latch at a second input;
   a third latch operable to receive the output signal of the first latch, wherein the third latch is to be clocked by the second edge of the clock signal;
   a fourth latch operable to receive the output signal of the second latch, wherein the fourth latch is to be clocked by the first edge of the clock signal;
   a second logic gate operable to receive an output signal of the third latch at a first input and an output signal of the fourth latch at a second input;
   a fifth latch operable to receive the output signal of the third latch, wherein the fifth latch is to be clocked by the first edge of the clock signal;
   a sixth latch operable to receive the output signal of the fourth latch, wherein the sixth latch is to be clocked by the second edge of the clock signal;
   a third logic gate operable to receive an output signal of the fifth latch at a first input and an output signal of the sixth latch at a second input;
   a seventh latch operable to receive the output signal of the fifth latch, wherein the seventh latch is to be clocked by the second edge of the clock signal;
   an eighth latch operable to receive the output signal of the sixth latch, wherein the eighth latch is to be clocked by the first edge of the clock signal;
   a fourth logic gate operable to receive an output signal of the seventh latch at a first input and an output signal of the eighth latch at a second input; and
   a summing circuit operable to receive an output signal from each of the logic gates and to generate the phase error signal in response to the output signals, wherein said phase error signal to be used to align both the first and second edges of the clock signal with a baud center of the data signal.

24. The phase detector circuit of claim 23, wherein the average frequency of the clock signal is half the frequency compared to the data rate of the data signal when the first and second edges of the clock signal are aligned with the baud center of the data signal.

25. The phase detector circuit of claim 23, comprised in a linear, half-rate clock and data recovery (CDR) circuit.

26. A linear, half-rate clock and data recovery (CDR) circuit, comprising:

a phase detector operable to receive a data signal and generate a phase error signal representative of the phase difference between the data signal and a clock signal, the phase detector circuit comprising:
   n latches operable to receive the clock signal, wherein each of n/2 input stages of the phase detector comprises a respective pair of latches of the n latches, wherein a respective pair of latches comprised at a first input stage is operable to receive the data signal, wherein each respective pair of latches comprises a first latch, and a second latch configured in parallel with the first latch, wherein the first latch is operable to be clocked by one edge of the clock signal and the second latch operable to be clocked by an opposite edge of the clock signal,
   n/2 logic gates, wherein the output signal of the first latch of each of the pairs of latches is received at a first input of the corresponding logic gate and the output signal of the second latch of each of the pairs of latches is received at a second input of the corresponding logic gate, and
   a summing circuit operable to receive an output signal from each of the n/2 logic gates and to generate the phase error signal in response to the output signals, wherein said phase error signal to be used to align both the first and second edges of the clock signal with a baud center of the data signal;
a loop filter operable to receive the phase error signal and generate a voltage control signal in response to the phase error signal; and
a voltage-controlled oscillator (VCO) operable to receive the voltage control signal and generate the clock signal in response to the voltage control signal, wherein the VCO is driven by the voltage control signal to align both the first and second edges of the clock signal with the baud center of the data signal;
wherein n is an even integer number greater than 3.

27. A system, comprising:
a first device comprising a first transceiver for transmitting and receiving information, wherein the first transceiver comprises a first linear, half-rate clock and data recovery (CDR) circuit, the half-rate CDR circuit comprising:
   a phase detector operable to receive a data signal and generate a phase error signal representative of the phase difference between the data signal and a clock signal, the phase detector circuit comprising:
   a plurality of pairs of latches operable to receive the clock signal, wherein each pair of the plurality of pairs of latches comprises a first latch, and a second latch configured in parallel with the first latch, wherein the first is operable to be clocked by one edge of the clock signal and the second latch is operable to be clocked by an opposite edge of the clock signal,
   a plurality of logic gates, wherein each of the plurality of logic gates is configured to receive an output from the first latch of a respective pair of the plurality of pairs of latches, and an output from the second latch of the respective pair of the plurality of pairs of latches, and
   a summing circuit operable to receive an output signal from each of the plurality of logic gates and generate the phase error signal in response to the output signals from the logic gates;
a loop filter operable to receive the phase error signal and generate a voltage control signal in response to the phase error signal; and a voltage-controlled oscillator (VCO) operable to receive the voltage control signal and generate the clock signal in response to the voltage control signal, wherein the VCO is driven by the voltage control signal to align both the first and second edges of the clock signal with a baud center of the data signal;

a communication medium coupled to the first device; and a second device coupled to the communication medium and comprising a second transceiver for transmitting and receiving information via the communication medium.

28. The system of claim 27, wherein the average frequency of the clock signal is half the frequency compared to the data rate of the data signal when the first and second edges of the clock signal are aligned with the baud center of the data signal.

29. The system of claim 27, wherein the second transceiver comprises a second linear, half-rate CDR circuit.

30. The system of claim 27, wherein the communication medium is a network.

31. The system of claim 27, wherein the first and second devices are Ethernet devices.

32. The system of claim 27, wherein the communication medium is a PCI Express bus.

* * * * *